United States Patent
Bhattacharyya et al.

(10) Patent No.: US 12,507,593 B2
(45) Date of Patent: Dec. 23, 2025

(54) SUBSTRATE THINNING PROCESS USING TEMPORARY BOND WITH LOW THICKNESS VARIATION

(71) Applicant: CORNING INCORPORATED, Corning, NY (US)

(72) Inventors: Indrani Bhattacharyya, Newark, CA (US); Julia Anne Dorothee Brueckner, Nieder-Olm (DE); Ya-Huei Chang, Zhudong Township (TW); Bokyung Kong, Hwaseong-si (KR); Prantik Mazumder, Ithaca, NY (US); Jun Ro Yoon, Painted Post, NY (US); Jian-Zhi Jay Zhang, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 627 days.

(21) Appl. No.: 17/515,630

(22) Filed: Nov. 1, 2021

(65) Prior Publication Data

US 2022/0140227 A1   May 5, 2022

Related U.S. Application Data

(60) Provisional application No. 63/171,309, filed on Apr. 6, 2021, provisional application No. 63/109,004, filed on Nov. 3, 2020.

(30) Foreign Application Priority Data

Dec. 21, 2020 (NL) .................................. 2027189

(51) Int. Cl.
*H01L 41/312* (2013.01)
*H01L 41/08* (2006.01)
(Continued)

(52) U.S. Cl.
CPC ......... *H10N 30/072* (2023.02); *H10N 30/086* (2023.02); *H10N 30/708* (2024.05); *H10N 30/8542* (2023.02)

(58) Field of Classification Search
CPC .. H10N 30/072; H10N 30/086; H10N 30/708; H10N 30/8542
(Continued)

(56) References Cited

U.S. PATENT DOCUMENTS 10,395,974 B1   8/2019   Chou et al.
10,579,165 B2   3/2020   He et al.
(Continued)

FOREIGN PATENT DOCUMENTS

EP   2623573 A2   8/2013
EP   2862846 A1   4/2015
(Continued)

OTHER PUBLICATIONS

European Patent Application No. 21206000.8, European Search Report, dated Mar. 14, 2022; 3 pages; European Patent Office.
(Continued)

*Primary Examiner* — Emily P Pham
*Assistant Examiner* — Monica Mata
(74) *Attorney, Agent, or Firm* — Amy T. Lang

(57) ABSTRACT

An article including a support unit, the support unit including a support substrate and a bonding layer such that the bonding layer is bonded to a surface of the support substrate. Furthermore, a total thickness variation TTV across a width of the support unit is about 2.0 microns or less.

16 Claims, 8 Drawing Sheets

(51) Int. Cl.
  *H01L 41/187*  (2006.01)
  *H01L 41/337*  (2013.01)
  *H10N 30/00*  (2023.01)
  *H10N 30/072*  (2023.01)
  *H10N 30/086*  (2023.01)
  *H10N 30/853*  (2023.01)
(58) Field of Classification Search
  USPC ............................................................ 310/358
  See application file for complete search history.

(56) References Cited

U.S. PATENT DOCUMENTS

| | | | |
|---|---|---|---|
| 10,643,884 B2 | 5/2020 | Beche et al. | |
| 10,665,494 B2 | 5/2020 | Kumar et al. | |
| 2004/0121618 A1 | 6/2004 | Moore | |
| 2007/0259468 A1 | 11/2007 | Chen et al. | |
| 2016/0079514 A1 | 3/2016 | Tai et al. | |
| 2019/0067738 A1* | 2/2019 | Ruther | H01M 50/403 |
| 2019/0176435 A1 | 6/2019 | Bellman et al. | |
| 2020/0039872 A1 | 2/2020 | Bellman et al. | |
| 2020/0091371 A1* | 3/2020 | Atanackovic | H01L 33/60 |
| 2020/0171799 A1 | 6/2020 | Adib et al. | |
| 2020/0181009 A1 | 6/2020 | Adib et al. | |
| 2021/0301419 A1* | 9/2021 | Kubota | H01L 21/0242 |

FOREIGN PATENT DOCUMENTS

| | | |
|---|---|---|
| JP | 2001-501368 A | 1/2001 |
| JP | 2002-305334 A | 10/2002 |
| JP | 2009-536108 A | 10/2009 |
| JP | 2013-179405 A | 9/2013 |
| JP | 2020-150488 A | 9/2020 |
| KR | 10-2016-0013518 A | 2/2016 |
| WO | 98/09804 A1 | 3/1998 |
| WO | 2017/087745 A1 | 5/2017 |

OTHER PUBLICATIONS

Tong, Q.Y., et al. "Semiconductor Wafer Bonding", Annu Rev Mater Sci, vol. 28, No. 1, 1998, pp. 215-241.

Korean Patent Application No. 10-2023-7018285, Office Action dated Jun. 24, 2025, 7 pages (English Translation only), Korean Patent Office.

Ranjith et al., "Low cost, room temperature debondable spin-on temporary bonding solution: A key enabler for 2.5D/3D IC packaging", IEEE 63rd Electronic Components and Technology Conference. IEEE, 2013, 21 pages.

Japanese Patent Application No. 2023-526933, Office Action dated Sep. 24, 2025, 5 pages (English Translation only), Japanese Patent Office.

* cited by examiner

SUBSTRATE THINNING PROCESS USING TEMPORARY BOND WITH LOW THICKNESS VARIATION

This application claims the benefit of priority under 35 U.S.C. § 119 of U.S. Provisional Application Ser. No. 63/109,004 filed on Nov. 3, 2020 and U.S. Provisional Application Ser. No. 63/171,309 filed on Apr. 6, 2021, the content of which is relied upon and incorporated herein by reference in its entirety.

FIELD OF THE DISCLOSURE

The present disclosure is generally directed to a temporary bonding process to provide substrate thinning, and more precisely to a bonding layer with low total thickness variation to provide a temporary bond during a substrate thinning process.

BACKGROUND OF THE DISCLOSURE

The thinning of a substrate to a very small thickness, for example 10 microns or less, requires a supporting member during the thinning process. Such enables handling of the substrate during the thinning process to prevent damage of the very thin substrate. However, material removal from the substrate, during the thinning process, must be uniform. Therefore, it is important that the supporting member provides an even baseline for the substrate to be processed. Because the substrate is bonded to the supporting member during the thinning process, if the supporting member is uneven or non-uniform, the substrate will also be processed to be uneven and non-uniform after the thinning process. Supporting members providing an even baseline are even more important when thinning a substrate to an extremely low thickness, for example down to one micron or less. Such thin substrates may be used in applications including surface acoustic wave (SAW) technologies. In these applications, an active material is processed to be less than one micron in thickness in order to increase the upper frequency limits of SAW filters.

Accordingly, a need exists to provide a supporting member with uniform dimensions during a thickness reduction process of a substrate.

SUMMARY OF THE DISCLOSURE

Substrates in various applications may be reduced in thickness to a precise thickness and flatness with the aid of a supporting member. The supporting member may first be processed to a specific and uniform thickness in order to provide an even baseline for the processing of the substrate. One aspect of uniformity, as discussed throughout this disclosure, is total thickness variation, which refers to deviation in thickness across a defined interval of an article. As discussed further below, a supporting member with high total thickness variation results in an uneven baseline, which can result in thinning of the substrate in an uneven manner. As also discussed further below, aspects of the present disclosure include not only a supporting member with a very low total thickness variation, but also a temporary bonding layer with a very low total thickness variation. The bonding layer provides a temporary bond between the supporting member and the substrate to be thinned during the thinning process.

FIG. 1 shows an exemplary process to provide a semiconductor article 1 in which a semiconductor wafer 10 (the supporting member) is bonded to a piezoelectric substrate 20 (the substrate). In this process, semiconductor wafer 10 has already been subject to an expensive and time consuming process of polishing to provide the specific flatness and uniformity requirements (including total thickness variation). Piezoelectric substrate 20 is then ground down and polished to a specific flatness and uniformity using a back-grinding process, in which piezoelectric substrate 20 remains bonded to semiconductor wafer 10 during the grinding process. Therefore, semiconductor wafer 10 provides a baseline for the grinding and polishing of piezoelectric substrate 20. However, the back-grinding process is non-reversible. Therefore, any deviation in flatness or uniformity produced during the grinding and polishing process of piezoelectric substrate 20 is non-reversible. It is extremely important that this grinding and polishing process starts with an even baseline.

FIGS. 2A and 2B further depict the importance of starting with an even baseline during the grinding and polishing process of piezoelectric substrate 20. As shown in FIG. 2A, if semiconductor wafer 10 is not uniform in thickness, then piezoelectric substrate 20 will be disposed on semiconductor wafer 10 in an uneven manner. In this example, semiconductor wafer 10 was not processed with high accuracy so that the wafer is thicker on the left side of the image than on the right side. Therefore, piezoelectric substrate 20 is not deposited on the wafer with an even baseline. Instead, as shown in FIG. 2A, the left side of piezoelectric substrate 20 is slightly higher than the right side of piezoelectric substrate 20. When the grinding wheel is lowered towards piezoelectric substrate 20, it will first contact the slightly higher left side of the substrate before the right sight of the substrate. As shown in FIG. 2B, such will cause piezoelectric substrate 20 to have an uneven thickness after the grinding and polishing process. More specifically, in this example, the left side of the substrate will be thinner than the right side of the substrate. Therefore, piezoelectric substrate 20 will not be a uniform layer with a consistent total thickness variation.

The non-uniformity in piezoelectric substrate 20 becomes even more apparent when the substrate is thinned down to an extremely small thickness of, for example, less than one micron. In these examples, the substrate may be so thin so that the substrate material is polished away on the left side of the substrate in FIG. 2B, thus exposing the underlying semiconductor wafer 10 on this side.

The embodiments of the present disclosure provide a unique process in which the substrate to be thinned is attached to a support substrate during the grinding and polishing process. A bonding layer provides a temporary bond between the substrate to be thinned and the support substrate during the grinding and polishing process. The bonding layer is advantageously very thin and is extremely uniform, with ultra-low total thickness variation, in order to provide an even baseline for the substrate to be thinned during its grinding and polishing process. The inventors are the first to produce such a temporary bonding layer with ultra-low total thickness variation, as this has not been commercially produced prior to this disclosure herein.

According to one embodiment, an article is provided. The article comprises a support unit comprising a support substrate having a surface and a bonding layer bonded to the surface of the support substrate. Furthermore, a total thickness variation (TTV) across a width of the support unit is about 2.0 microns or less.

According to another embodiment, an article is provided. The article comprises a support unit comprising a support substrate having a surface and a bonding layer bonded to the surface of the support substrate. A total thickness variation (TTV) across a width of the support unit is about 2.0 microns or less. Additionally, the article comprises a first substrate and a device support wafer. The bonding layer couples the support substrate with the first substrate, and the device support wafer is removably coupled with the support substrate.

According to another embodiment, a method of providing a thin substrate using a support unit is provided. The method comprises bonding a first substrate to a support substrate with a bonding layer. The support substrate and the bonding layer forming a support unit having a total thickness variation (TTV) across a width of the support unit of about 2.0 microns or less.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
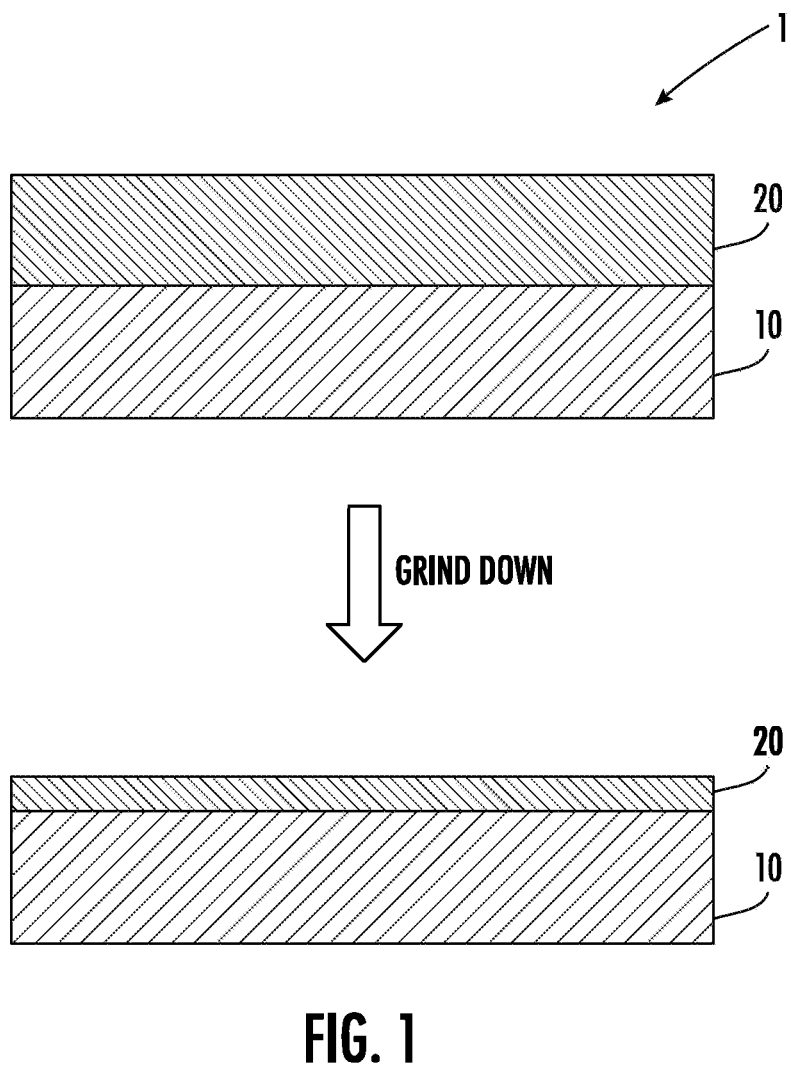
FIG. 1 is a schematic diagram illustrating a process of polishing a piezoelectric substrate on a semiconductor article.
Figure 2A:
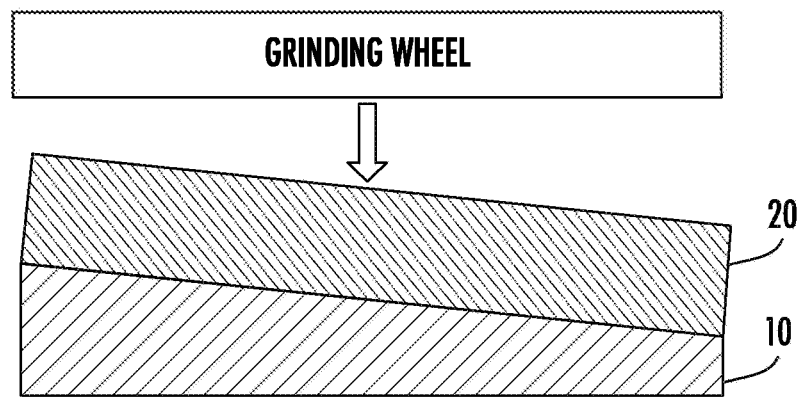
FIGS. 2A and 2B are schematic diagrams illustrating a process of polishing a piezoelectric substrate on a semiconductor article.
Figure 2B:
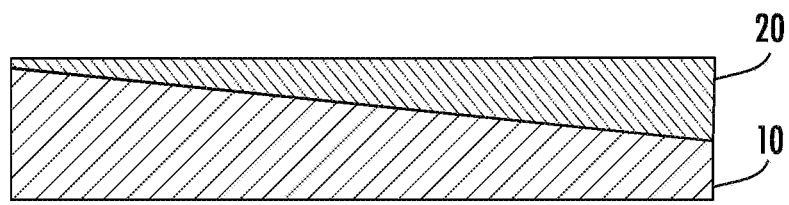

Additional features and advantages of the disclosure will be set forth in the detailed description which follows and will be apparent to those skilled in the art from the description, or recognized by practicing the disclosure as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

It is also important to note that the construction and arrangement of the elements of the disclosure, as shown in the exemplary embodiments, is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel and nonobvious teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present disclosure. Other substitutions, modifications, changes, and omissions may be made in the design, operating conditions, and arrangement of the desired and other exemplary embodiments without departing from the spirit of the present disclosure.

Reference will now be made in detail to the present preferred embodiments of the disclosure, examples of which are illustrated in the accompanying drawings. Whenever possible, the same reference numbers will be used throughout the drawings to refer to the same or like parts.

Figure 3:
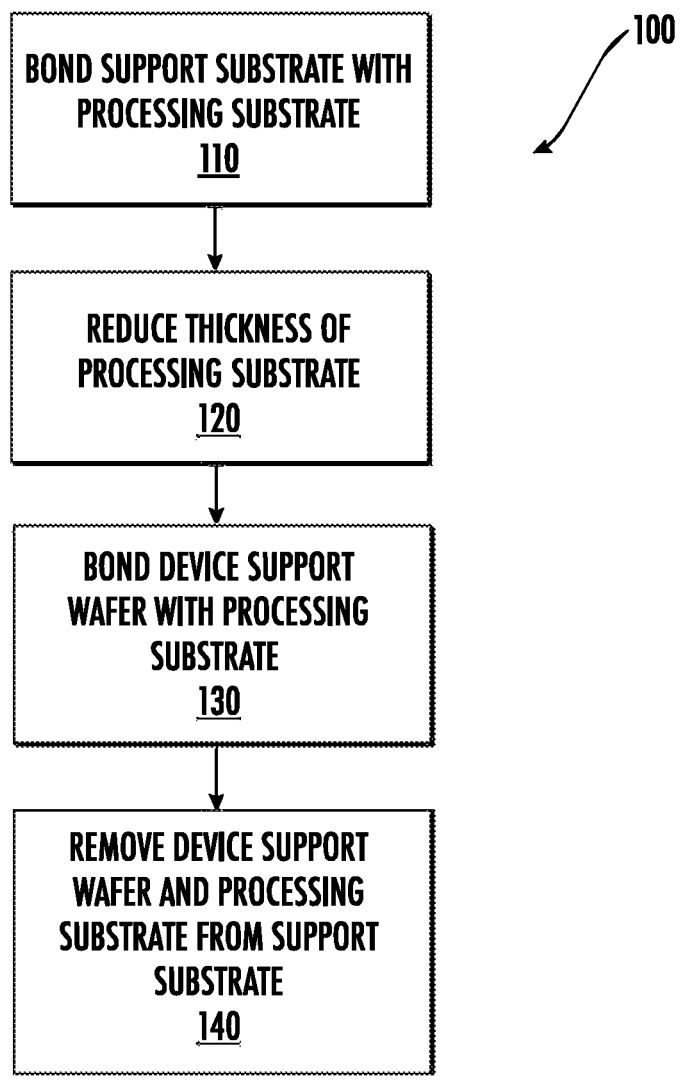
FIG. 3 is a flow chart illustrating a process to form an article according to the embodiments of the present disclosure.

Referring now to FIG. 3, a process 100 is shown, according to embodiments of the present disclosure, of thinning a substrate using a temporary bond to form an article. In some embodiments, the article is a semiconductor article. However, it is noted that the steps of process 100 may be used to form other articles and components than a semiconductor article. At step 110, the process comprises bonding a support substrate with a processing substrate. As discussed further below, the bond is formed by a bonding layer having ultra-low total thickness variation and a very small thickness. Thus, the bonding layer provides a uniform and flat surface that does not significantly contribute to the overall dimensions of the article. Such is advantageous when reducing the thickness of the processing substrate at step 120, as the processing substrate may be bonded to the support substrate in a precisely uniform manner. The processing substrate is a substrate to be thinned during a thickness reducing process. A device support wafer, for example, is permanently bonded to the processing substrate at step 130. And, at step 140, the device support wafer and processing substrate are removed and de-bonded from the support substrate, thus forming a final product comprising the device support wafer and the processing substrate. It is noted that the final product formed at step 140 includes the device support wafer but does not include the support substrate. Additionally, the final product formed at step 140 may be subjected to further downstream processing.

One or more of the bonding layers, substrates, and wafers disclosed herein may have a low total thickness variation in order to provide a final product with a low total thickness variation.

Figure 4:
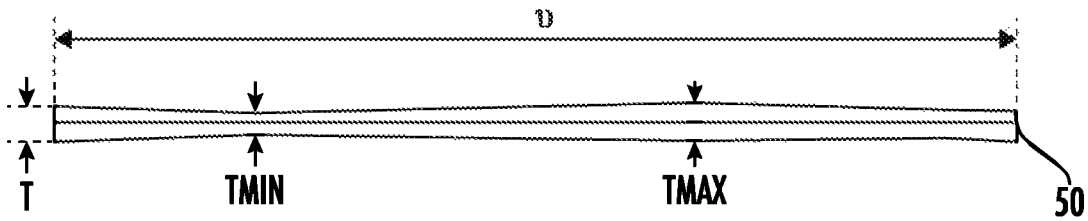
FIG. 4 is an edge view of an exemplary substrate exhibiting thickness deviations, and illustrating measurement of total thickness variation (TTV)

As used herein, total thickness variation (TTV) refers to the difference between the maximum thickness and the minimum thickness of a substrate across a defined interval v, typically an entire width of the substrate, of an unclamped (free state) substrate. FIG. 4 provides an exemplary substrate 50 exhibiting thickness deviations and illustrating the TTV measurement. As shown in FIG. 4, TTV in this exemplary substrate is the difference between $T_{max}$ and $T_{min}$ of the unclamped substrate 50. It is noted that the TTV of a substrate is distinguished from the bow or the warp (flatness) of the substrate.

Figure 5:
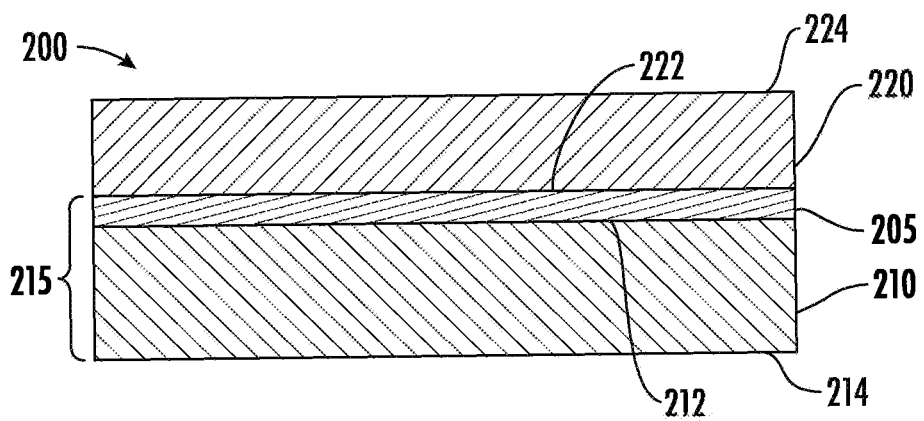
FIG. 5 is a cross-sectional view of an article according to embodiments of the present disclosure.

Referring again to FIG. 3, at step 110, a support substrate is bonded to a processing substrate. As shown in FIG. 5, an article 200 comprising an exemplary support substrate 210 bonded to a first substrate 220 using a bonding layer 205 is shown. First substrate 220 may be a processing substrate that is thinned during a thickness reducing process. Support substrate 210 comprises first surface 212 and second surface 214, and first substrate 220 comprises first surface 222 and second surface 224. First surface 212 of support substrate 210 is bonded to first surface 222 of substrate 220 through bonding layer 205. The bond is a temporary bond that may be removed through mechanical, chemical, thermal, and/or light based means, as discussed further below. Thus, support substrate 210 provides a stable platform for substrate 220 when the thickness of substrate 220 is reduced. Support substrate 210 and bonding layer 205 together form a support unit 215. As also discussed further below, support unit 215 has a very low total thickness variation (TTV).

Support substrate 210 may be comprised of glass or glass ceramic such as, for example, silicate glass, an aluminosilicate glass, alkali aluminosilicate glass, alkaline aluminosilicate glass, borosilicate glass, boro-aluminosilicate glass, alkali aluminoborosilicate glass, alkaline aluminoborosilicate glass, soda-lime glass, fused quartz (fused silica), or other types of glass. Exemplary glass substrates include, but are not limited to, HPFS® ArF Grade Fused Silica sold by Corning Incorporated of Corning, New York under glass codes 7980, 7979, and 8655, and Corning® EAGLE XG® Glass, e.g., boro-aluminosilicate glass also sold by Corning Incorporated of Corning, New York. Other glass substrates include, but are not limited to, Corning Lotus™ NXT Glass, Corning Iris™ Glass, Corning® WILLOW® Glass, Corning® Gorilla® Glass, Corning VALOR® Glass, or PYREX® Glass sold by Corning Incorporated of Corning, New York. In some embodiments, the glass or glass ceramic has 50 wt. % or more, 60 wt. % or more, 70 wt. % or more, 80 wt. % or more, 90 wt. % or more, or 95 wt. % or more silica content by weight on an oxide basis. In other embodiments, support substrate 210 is comprised of ceramic or silicon.

Support substrate 210 may be pre-processed to have a TTV across an entire width of the substrate and between first and second surfaces 212, 214 of about 3.0 microns or less, or about 2.5 microns or less, or about 2.0 microns or less, or about 1.7 microns or less, or about 1.5 microns or less, or about 1.2 microns or less, or about 1.0 microns or less, or about 0.7 microns or less, or about 0.5 microns or less, or about 0.3 microns or less, or about 0.2 microns or less, or about 0.1 microns or less, or about 0.0 microns. Thus, support substrate 210 may have an ultra-low TTV value.

In some embodiments, support substrate 210 has a thickness (i.e., between first and second surfaces 212, 214) in a range from about 0.1 mm to about 5 mm, or from about 0.2 mm to about 2.0 mm, or from about 0.3 mm to about 1.0 mm. The thickness of support substrate 210 should be sufficiently thick so that it provides a stable platform that does not bend or flex during the grinding process of first substrate 220.

First substrate 220, in some embodiments, comprises a piezoelectric crystal material including, for example, lithium tantalate ($LiTaO_3$), lithium niobate ($LiNbO_3$), aluminum nitride (AlN), and/or lead zirconate titanate (PZT) (Pb$[Zr_xTi_{1-x}]O_3$ (0≤x≤1). In other embodiments, first substrate 220 comprises glass, glass ceramic, or ceramic, including, for example, sapphire or silicon carbide. In yet other embodiments, first substrate 220 may comprise one or more semiconductor materials including, for example, silicon, germanium, gallium arsenide, indium antimonite, indium arsenide, gallium nitride, and/or indium phosphide. It is also contemplated that first substrate 220 is formed of one or more of the materials disclosed above with reference to support substrate 210. First substrate 220 may be comprised of a single layer of material or a plurality of layers of the same or different materials.

In some embodiments, the material of support substrate 210 is optimally chosen to correspond to the material of first substrate 220 for coefficient of thermal expansion (CTE) matching purposes. In some embodiments, support substrate 210 is bonded to first substrate 220 such that these substrates are in contact with each other. Therefore, large differences in thermal expansion between the substrates could be a problem when the bonded substrates are thermally annealed, as discussed further below, or otherwise exposed to a thermally variable environment. Due to large differences in CTE between the material of support substrate 210 and that of first substrate 220, when the substrates are thermally annealed and then cooled (or exposed to a thermally variable environment), the substrate with the relatively higher CTE expands and shrinks more than the substrate with the relatively lower CTE so that one or both of the substrates may break after the annealing process. Matching (or substantially matching) the CTE between the material of support substrate 210 and that of first substrate 220 is important, especially when the substrates are annealed at temperatures of 200° C. or greater. Additionally or alternatively, the thicknesses of support substrate 210 and/or first substrate 220 are optimally chosen to reduce stress associated with any CTE mismatch between the materials of support substrate 210 and first substrate 220.

In some embodiments, a difference between the CTE of the material of support substrate 210 and the CTE of the material of first substrate 220, at a temperature of 250° C., is from 0 ppm/° C. to about 1.0 ppm/° C., or from about 0.3 ppm/° C. to about 0.7 ppm/° C. However, it was also found that when the CTE difference between the material of support substrate 210 and the material of first substrate 220 is relatively high (such as, for example, about 10 ppm/° C. or higher), the peak temperature during the thermal annealing process should be kept low (such as, for example, about 100° C. or lower) to reduce stress and associated breakage between the two materials.

Before first substrate 220 is reduced in thickness at step 120, first substrate 220 may have a thickness (i.e., between first and second surfaces 222, 224) in a range from about 10 microns to about 1,000 microns, or from about 50 microns to about 800 microns, or from about 100 microns to about 400 microns. After first layer 220 is reduced in thickness at step 120, it may have a thickness of about 10 microns or less, or about 5 microns or less, or about 3 microns or less, or about 2 microns or less, or about 1 micron or less, or in a range from about 0.2 microns to about 2.0 microns, or about 0.4 microns to about 1.8 microns, or about 0.5 microns to about 1.7 microns, or about 0.6 microns to about 1.5 microns, or about 0.8 microns to about 1.2 microns.

Bonding layer 205 may be directly disposed on first surface 212 of support substrate 210 and directly disposed on first surface 222 of first substrate 220. However, it is also contemplated that one or more additional materials may be disposed between bonding layer 205 and support substrate 210 and between bonding layer 205 and first substrate 220. Bonding layer 205 may form a single continuous layer between support substrate 210 and first substrate 220. Alternatively, bonding layer 205 may include one or more discontinuous and separated portions of the layer formed by, for example, one or more gaps or voids in the layer. Therefore, in some embodiments, bonding layer 205 may cover less than 100% of surfaces 212, 222 of support substrate 210 and first substrate 220, respectively.

Bonding layer 205 may be sufficiently strong to maintain the bond between support substrate 210 and first substrate 220 while first substrate 220 is reduced in thickness at step 120. Thus, bonding layer 205 must be sufficiently strong to prevent any delamination of support substrate 210 or first substrate 220 caused by the shear force applied to these layers during the thickness reduction step. In some embodiments (as discussed further below), first substrate 220 is reduced in thickness by a back-grinding process, which can include an aggressive grinding of first substrate 220. Therefore, bonding layer 205 must be sufficiently strong to prevent any shear strain of the layers. However, bonding layer 205 must also be able to create a temporary bond that is de-bondable after the thickness reducing process.

In some embodiments, bonding layer 205 provides a bond strength between support substrate 210 and first substrate 220 of about 200 mJ/m² or greater, or about 500 mJ/m² or greater, or about 600 mJ/m² or greater, or about 800 mJ/m² or greater, or about 1 J/m² or greater. Additionally or alternatively, the bond strength between support substrate 210 and first substrate 220 is about 1 J/m² or less, or about 800 mJ/m² or less, or about 100 mJ/m² or less. In some embodiments, bonding layer 205 is thermally annealed after bonding to support substrate 210 and first substrate 220 to increase its bond strength. For example, bonding layer 205 may be thermally annealed at a temperature in a range of about 100° C. to about 500° C. for about 5 minutes to about 20 hours. In one embodiment, bonding layer 205 was annealed at 250° C. for 30 minutes, which increased the bond energy from 76.4 mJ/m² to 386.7 mJ/m². In another embodiments, bonding layer 205 was annealed at 450° C. for 10 minutes, which increased the bond energy from 116.9 mJ/m² to 388.3 mJ/m².

Bond strength measurements were accomplished using the wedge test method, as discussed in Tong, Q. Y., et al. "Semiconductor Wafer Bonding", Annu Rev Mater Sci, vol. 28, no. 1. pp. 215-241, 1998, which is incorporated herein by reference. In particular, the bond strength (or bond energy or adhesion strength) was determined by inserting a thin blade between support substrate 210 and first substrate 220 and measuring the crack length. The bond strength W is related to the Young's modulus $E_1$ of support substrate 210, the thickness $t_{w1}$ of support substrate 210, the Young's modulus $E_2$ of first substrate 220, the thickness $t_{w2}$ of first substrate 220, a thickness $t_b$ of the blade, and a crack length L, as show in equation (1):

$$W = \frac{3}{8} \frac{t_b^2 E_1 t_{w1}^3 E_2 t_{w2}^3}{L^4 (E_1 t_{w1}^3 + E_2 t_{w2}^3)} \quad (1)$$

As discussed further below, although bonding layer 205 provides a very strong bond between support substrate 210 and first substrate 220, the bond is still de-bondable through mechanical, chemical, thermal, and/or light based means. Therefore, the bond is a temporary bond.

Bonding layer 205 may have a TTV across an entire width of the layer of about 3.0 microns or less, or about 2.5 microns or less, or about 2.0 microns or less, or about 1.7 microns or less, or about 1.5 microns or less, or about 1.2 microns or less, or about 1.0 microns or less, or about 0.7 microns or less, or about 0.5 microns or less, or about 0.3 microns or less, or about 0.2 microns or less, or about 0.1 microns or less, or about 0.0 microns. Thus, bonding layer 205 may have an ultra-low TTV value. In some embodiments, bonding layer 205 has a lower TTV value than that of support substrate 210. Bonding layer 205 may have such a low TTV value that it does not contribute to the overall TTV value of support unit 215 and, therefore, may be referred to as having "zero-TTV."

As discussed above, both bonding layer 205 and support substrate 210 have ultra-low TTV values. Therefore, the total support unit 215 (which is comprised of bonding layer 205 and support substrate 210) may also have an ultra-low TTV value. In some embodiments, support unit 215 has a TTV across an entire width of the unit of about 3.0 microns or less, or about 2.5 microns or less, or about 2.0 microns or less, or about 1.7 microns or less, or about 1.5 microns or less, or about 1.2 microns or less, or about 1.0 microns or less, or about 0.7 microns or less, or about 0.5 microns or less, or about 0.3 microns or less, or about 0.2 microns or less, or about 0.1 microns or less, or about 0.0 microns.

Bonding layer 205 may have a very small thickness, such as, for example, in range of about 100 nm or less, or about 80 nm or less, or about 60 nm or less, or about 40 nm or less, or about 20 nm or less, or about 10 nm or less, or about 5.0 nm or less, or about 3.0 nm or less, or about 2.0 nm or less, or about 1.0 nm or less, or about 0.5 nm or less. Additionally or alternatively, the thickness of bonding layer 205 may be about 0.1 nm or greater, or about 0.2 nm or greater, or about 0.3 nm or greater, or about 0.5 nm or greater. In some embodiments, the thickness of bonding layer 205 is in a range from about 2 nm to about 40 nm, or about 10 nm to about 30 nm, or about 20 nm to about 25 nm. In some embodiments, bonding layer 205 is formed of a single row of molecules such that the thickness of bonding layer 205 is the thickness of the molecules themselves. In the embodiments in which bonding layer 205 has such a small thickness, it does not contribute to the overall thickness or dimensions of article 200 or of support unit 215. Exemplary materials for bonding layer 205 are disclosed further below.

In the embodiments in which bonding layer 205 has such a small thickness, support substrate 210 and/or first substrate 220 may have a low surface roughness in order to increase the mating and bonding of these two substrates. For example, support substrate 210 and/or first substrate 220 may have a surface roughness from about 2.0 nm or less, or about 1.5 nm or less, or about 1.0 nm or less, or about 0.5 nm or less, or about 0.25 nm or less, or about 0.15 nm or less, or about 0.10 nm or less, as measured by Atomic Force Microscope (AFM) on 2×2 $\mu m^2$ areas across the substrate. Therefore, support substrate 210 has not only ultra-low TTV but also low surface roughness, which advantageously provides improved bonding during the uniform thickness reducing step disclosed herein. It is further noted that the above-disclosed surface roughness values are not limited to the embodiments in which bonding layer 205 has a small thickness and may be used in all of the thickness embodiments of bonding layer 205 disclosed herein.

Referring again to FIG. 3, the thickness of first substrate 220 is reduced at step 120. During this step, first substrate 220 is bonded to support substrate 210 via bonding layer 205. The thickness of first substrate 220 may be reduced using any well-known suitable process such as, for example, a grinding, chemical, or mechanical processes. Exemplary processes include a chemical mechanical planarization (CMP) process, an ion-beam material removal process, a dry plasma etching process, and a wet etch process. A suitable grinding process may include a rough grinding process and a fine grinding process. During the thinning process, first substrate 220 may be subjected to additional thermal annealing, such as intermediate annealing steps intermixed with the thickness reduction process.

During step 120, first substrate 220 is secured to support unit 215 with the ultra-low TTV value. Therefore, the ultra-low TTV support unit 215 provides an even level baseline during the reduction in thickness of first substrate 220. The reduction in thickness of first substrate 220 is uniform, and the resulting thinner substrate 220 has a constant thickness. It is further noted that support unit 215 provides a stable platform that allows first substrate 220 to be reduced in thickness so that it not only has a final thickness that is uniform but that is also very thin.

When used, for example, in a semiconductor article, it is important to control the thickness and uniformity of first substrate 220 in order to optimize mode stability required for RF filter performance. For example, a thin and uniform substrate reduces undesirable frequency shifts from variations in temperature, reduces insertion loss while increasing the upper frequency limit of SAW filters, helps to improve Q (Quality factor) and filter cutoff sharpness and, thus, allows design of wider bandwidth filters, and provides improves transmission with high frequency selectivity.

In embodiments in which first substrate 220 is reduced in thickness using a grinding process, such may be referred to as a back-grinding process because first substrate 220 remains attached to support substrate 210 during the grinding process. During the back-grinding process, a large grit may be used to coarsely grind the substrate and remove the bulk of the excess substrate. Next, a fine grit may be used to polish the substrate and to accurately grind the substrate to the desired thickness.

Figure 6:
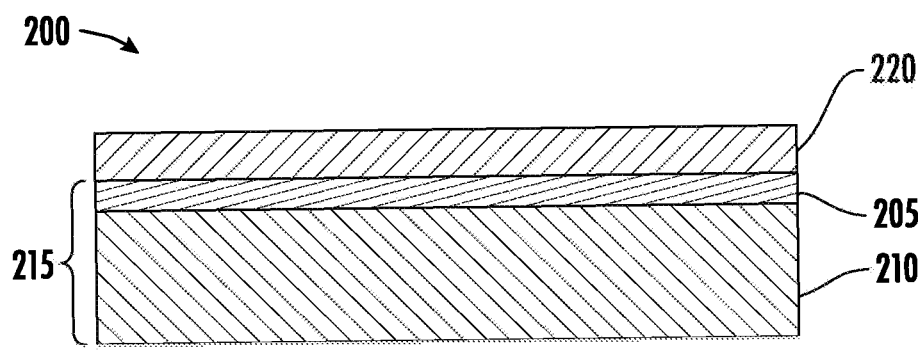
FIG. 6 is another cross-sectional view of the article according to embodiments of the present disclosure.

FIG. 6 shows an exemplary first substrate 220 after it has been reduced in thickness from a first thickness (before the thickness reduction step) to a second thickness (after the thickness reduction step). As shown in FIGS. 5 and 6, the second thickness of first substrate 220 is less than the first thickness of first substrate 220. In some embodiments, first substrate 220 is reduced in thickness by about 90% or greater, or about 95% or greater, or about 97% or greater, or about 99% or greater.

Figure 7:
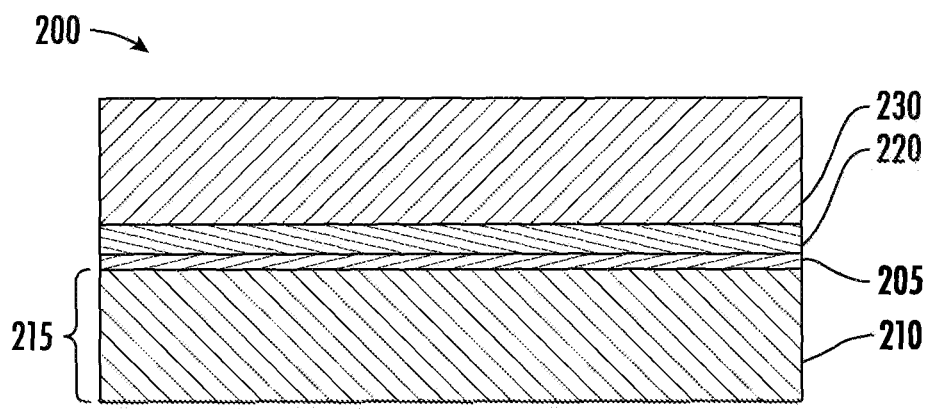
FIG. 7 is another cross-sectional view of the article according to embodiments of the present disclosure.

Referring again to FIG. 3, at step 130, a device support wafer is bonded with first substrate 220. As shown in FIG. 7, a device support wafer 230 may be bonded to first substrate 220 such that first substrate 220 is disposed between device support wafer 230 and support substrate 210. The bond between device support wafer 230 and first substrate 220 may be a permanent bond. Although not shown in FIG. 7, one or more additional layers may be disposed between device support wafer 230 and first substrate 220, such as a silicon dioxide layer and/or a polycrystalline silicon layer. These additional layers may help to passivate device support wafer 230 to reduce signal losses in the wafer.

It is again noted that first substrate 220 is reduced in thickness before it is bonded with device support wafer 230. Therefore, the uniformity and thinness of first substrate 220 is not dependent on device support wafer 230, which reduces manufacturing costs and time.

Device support wafer 230 may be configured to support electrodes or electrical circuits. Exemplary materials of device support wafer 230 include, for example, glass, glass ceramic, or ceramic, including, for example, sapphire or silicon carbide. In yet other embodiments, device support wafer 230 may comprise one or more semiconductor materials including, for example, silicon, germanium, gallium arsenide, indium antimonite, indium arsenide, gallium nitride, and/or indium phosphide. It is also contemplated that device support wafer 230 is formed of one or more of the materials disclosed with reference to support substrate 210, as discussed above. In some embodiments, device support wafer 230 is a semiconductor wafer comprised of silicon.

Device support wafer 230 may have a thickness in a range from about 500 microns to about 900 microns, or about 600 microns to about 700 microns. In some embodiments, device support wafer 230 has a thickness of about 600 microns, or about 625 microns, or about 650 microns. Further thinning of device support wafer 230 is also practiced in some embodiments to reduce the overall height of the final device before packaging.

Figure 8:
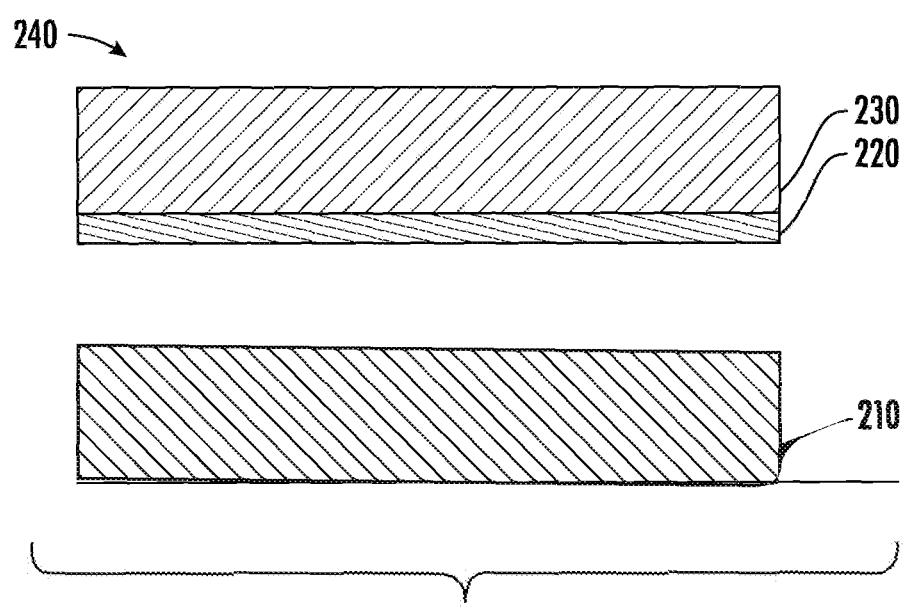
FIG. 8 is another cross-sectional view of the article according to embodiments of the present disclosure.

After the bonding of device support wafer 230 with first substrate 220 (and, thus with support unit 215), device support wafer 230 and first substrate 220 are removed from support substrate 210 (step 140 of FIG. 3). Thus, bonding layer 205 is de-bonded such that these components are separated from each other. The de-bonding of these components forms article 240, which is comprised of device support wafer 230 and first substrate 220. FIG. 8 shows article 240 after its separation from support substrate 210. In some embodiments, article 240 is a semiconductor article.

During the de-bonding process, bonding layer 205 may remain attached to support substrate 210 such that article 240 is also separated from bonding layer 205. After the de-bonding process, bonding layer 205 may be removed from support substrate 210 using, for example, a cleaning process. Support substrate 210 may then be reused for other substrate thinning processes. Thus, the de-bonding process does not significantly alter or destroy the chemical or mechanical nature of support substrate 210 (more specifically, first surface 212 of support substrate 210) so that the substrate may be reused for other processes. By reusing support substrate 210, the cost to fabricate the substrate is spread over may uses, thus reducing overall costs.

The de-bonding process successfully removes article 240 from support substrate 210 without breakage of device support wafer 230 or first substrate 220. As discussed above, the de-bonding process may include mechanical, chemical, thermal, and/or light (e.g., laser) based means. In one embodiment, the components are de-bonded using a suction force applied to a surface of device support wafer 230 (i.e., the top surface in FIG. 7 that is disposed furthest from support substrate 210). The suction force helps to pull device support wafer 230 and first substrate 220 away from support substrate 210. Additionally, a blade is inserted between first substrate 220 and support substrate 210 to remove and prop up a first corner of first substrate 220 away from support substrate 210. After the debonding of this first corner, support substrate 210 is then lifted and removed from (i.e., peeled from) first substrate 220 to fully de-bond these components, thus providing the final article 240.

In some embodiments, the suction force may be in a range from about 5 kN to about 15 kN, or about 7 kN to about 12 kN, or about 8 kN to about 10 kN. For example, the suction force is about 8 kN, 8.5 kN, or about 9 kN, or about 9.4 kN, or about 9.6 kN.

Exemplary Materials of Bonding Layer

In some embodiments, bonding layer 205 comprises an organic material comprised of, for example, surfactants, organic salts, polymers, or combinations thereof. The organic material may interact with the —OH groups in support substrate 210 and in first substrate 220 to bond the substrates together. Additionally or alternatively, bonding layer 205 comprises an inorganic material. Exemplary organic materials of bonding layer 205 include one or more hydrocarbons, one or more cationic surfactants, one or more cationic polymers, one or more anionic polymers, one or more organometallics, or combinations thereof. Exemplary inorganic materials of bonding layer 205 include silicates, organosilicates, titanates, diamond-like carbons, or combinations thereof.

As used herein, surfactants are amphiphilic surface active agents having a hydrophilic head and one or more hydrophobic tails. The hydrophobic tails of the surfactants may comprise a hydrocarbon chain having from four carbons to at least 24 carbons (C4-$C_{24}$). The hydrocarbon chains can be saturated or unsaturated and can be straight, branched or aromatic. Suitable nonionic surfactants includes those disclosed in WO 2017/087745A1, herein incorporated by reference. Thus, the hydrophilic head groups according to the present disclosure are preferably cationic head groups, i.e. head groups having a cationic functional group. Cationic nitrogen-containing head groups can include primary, secondary, tertiary or quaternary ammonium groups, pyridinium, pyrrolinium, imidazolium, guanidinium cations, or any other nitrogen-containing cation suitable for use as a surfactant head group. Other cations, such as phosphonium or sulfonium can also form suitable cationic head groups. In some embodiments, the cationic polymer is free, or substantially free, of oxygen.

Organic salts as used herein can include any salt comprising an organic ion. Preferred organic salts according to the disclosure contain organic cations, such as nitrogen-containing cations, including but not limited to primary, secondary, tertiary or quaternary ammonium groups, pyridinium, pyrrolinium, imidazolium, and guanidinium cations. Other organic cations suitable for use as organic salts can also be used. In some embodiments, the organic salt is free, or substantially free, of oxygen.

Because of their highly hydrophilic and water soluble nature, cationic surfactants and organic salts allow for simplified application onto support substrate 210 and/or first substrate 220. An aqueous solution of the compound can be made and then support substrate 210 and/or first substrate 220 can be treated by a variety of simple dispensing methods, such as spin coating, dip coating, spray coating, and combinations thereof. Aqueous processing also advantageously avoids the need for organic solvents, thereby decreasing the cost and environmental impact.

In one example, bonding layer 205 can be formed by the deposition of a cationic surfactant comprising an ammonium cation. The ammonium cation can be a primary, secondary, tertiary or quaternary ammonium cation. In the cases of a secondary, tertiary or quaternary ammonium cation, the nitrogen can be independently substituted with a wide variety of substituents, including but not limited to alkyl, vinyl, allyl or amino, and glycidyl. Each substituent can be further substituted, unsubstituted, protected, or unprotected. Where an alkyl substituent is selected, the substituent may be branched or unbranched, saturated or unsaturated. Examples of alkyl groups include methyl, ethyl, n-propyl, iso-propyl, n-butyl, iso-butyl, tert-butyl, n-hexyl, n-decyl, tetradecyl, and the like. Methyl and ethyl substitution is particularly preferred. In one example, the cationic surfactant can be cetyltrimethylammonium bromide (CTAB) (I), or other comparable salt or derivative thereof. In another example, the cationic surfactant can be octyltrimethylammonium bromide (OTAB) (II), or other comparable salt or derivative thereof.

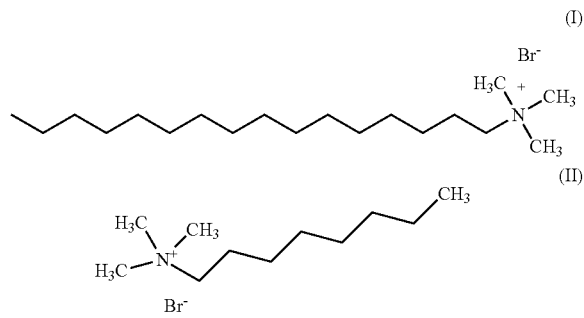

In another example, bonding layer 205 can be formed by the deposition of a cationic surfactant comprising a pyridinium cation. The aromatic ring of the pyridine can further include any suitable number of substituents covalently bonded to one or more of the ring carbons and/or the nitrogen, and can be independently selected from H, alkyl, vinyl, allyl, amino, glycidyl, and thiol. Each substituent can be further substituted, unsubstituted, protected, or unprotected. Where an alkyl substituent is selected, the substituent may be branched or unbranched, saturated or unsaturated. Examples of alkyl groups include methyl, ethyl, n-propyl, iso-propyl, n-butyl, iso-butyl, tert-butyl, n-hexyl, n-decyl, tetradecyl, and the like. Preferred examples of cationic surfactants containing pyridinium cations include cetylpyridinium chloride (CPCl) (III) and 1-butylpyridinium chloride (BPCl) (IV) or other comparable salts or derivatives thereof.

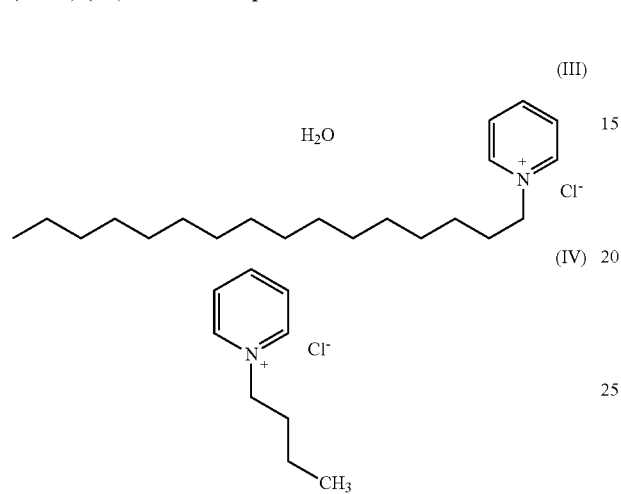

In yet another example, bonding layer 205 can be formed by the deposition of an organic salt comprising an ammonium cation. Like the cationic surfactants described above, the ammonium cation of the organic salt can be a primary, secondary, tertiary or quaternary ammonium cation. In the cases of a secondary, tertiary or quaternary ammonium cation, the nitrogen can be substituted with a wide variety of substituents, including but not limited to alkyl, vinyl, allyl or amino, and glycidyl. The substituents can be the same or different. Each substituent can be further substituted, unsubstituted, protected, or unprotected. Where an alkyl substituent is selected, the substituent may be branched or unbranched, saturated or unsaturated. Examples of alkyl groups include methyl, ethyl, n-propyl, iso-propyl, n-butyl, iso-butyl, tert-butyl, n-hexyl, n-decyl, tetradecyl, and the like. Methyl and ethyl substitution is particularly preferred. In particularly preferred examples, the organic salt can be tetramethylammonium bromide (TMAB) (V) or tetraethylammonium bromide (TEAB) (VI), or other comparable salts or derivatives thereof.

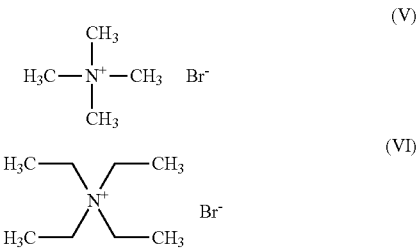

In yet another example, bonding layer 205 can be formed by the deposition of an organic salt comprising a phosphonium cation. The phosphonium cation can be a primary, secondary, tertiary or quaternary phosphonium cation. In the cases of a secondary, tertiary or quaternary phosphonium cation, the phosphorus can be substituted with a wide variety of substituents, independently selected from H, alkyl, vinyl, allyl, amino, glycidyl, among others. Phenyl substitution is particularly preferred. In one example, the organic salt can be tetraphenylphosphonium chloride (TPhPCl) (VII) or other comparable salt or derivative thereof.

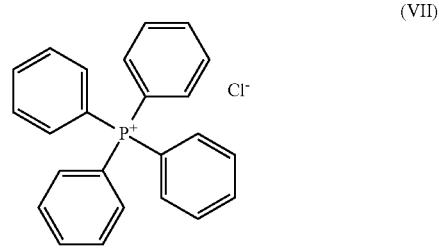 [SMILES: c1ccc([P+](c2ccccc2)(c2ccccc2)c2ccccc2)cc1 ; [Cl-]]

In some embodiments, the organic material of bonding layer 205 comprises polycationic polymers, which includes any polycation-based polymer that is suitable for a liquid- or solution-based surface treatment/coating process. In particular, polycationic polymers that are water soluble and/or hydrophilic are particularly preferred. Polycationic polymers having a polyalkyl backbone are particularly preferred. Also preferred are polycationic polymers comprising aromatic groups, which have higher thermal stability generally. Polycationic repeating units can comprise one or more of a positively charged nitrogen, phosphorous, sulfur, boron, or carbon. In particular are polycationic repeating units comprising primary, secondary, tertiary, or quaternary ammonium cations, imidazolium cations, pyridinium cations, pyrimidinium cations, pyrrole cations, imidazolium cations, iminium cations, phosphonium ions, sulfonium ions, or combinations thereof. Particularly preferred are polycationic repeating units comprising positively charged nitrogens, especially ammonium, pyridinium, and imidazolium cations. In some embodiments, the repeating unit of the polymer comprises a ratio of carbon:nitrogen of from 2:1 to 20:1, or from 3:1 to 15:1, or from 3:1 to 12:1. In some embodiments, the cationic polymer is free, or substantially free, of oxygen.

In some embodiments, the organic material of bonding layer 205 comprises polyanionic polymers. Similar to the polycationic polymers, the polyanionic polymers according to the present disclosure include any polyanion-based polymer that is as thermally stable as possible and that is suitable for a liquid- or solution-based surface treatment and/or coating process. Specifically, water-soluble and/or hydrophilic polyanionic polymers are preferred. In some embodiments, the repeating unit of the anionic polymer contains a negatively charged oxygen, sulfur, nitrogen, or phosphorus. In some embodiments, the repeating unit of the anionic polymer contains a negatively charged oxygen. In addition, polyanionic repeating units consisting of repeating units comprising polyacrylate ions, polysulfate ions, sulfonate ions, or combinations thereof are also preferred. Particularly preferred are sulfonate anions.

In one example, bonding layer 205 can be formed by the deposition of a polymer comprising an ammonium cation. The ammonium cation can be a primary, secondary, tertiary or quaternary ammonium cation. In the cases of a secondary, tertiary or quaternary ammonium cation, the nitrogen can be substituted with a wide variety of substituents, including but not limited to alkyl, vinyl, allyl or amino, and glycidyl. Each substituent can be further substituted, unsubstituted, protected, or unprotected. Where an alkyl substituent is selected, the substituent may be branched or unbranched, saturated or unsaturated. Examples of alkyl groups include methyl, ethyl, n-propyl, iso-propyl, n-butyl, iso-butyl, tert-butyl, n-hexyl, n-decyl, tetradecyl, and the like. Methyl and ethyl substitution is particularly preferred. In one example, the polymer can be poly(diallyldimethylammonium chloride) (PDADMAC) (VIII), or other comparable salt or derivative thereof. In another example, the polymer can be poly(vinylbenzyl trimethyl ammonium chloride) (PVBTACl) (IX), or other comparable salt or derivative thereof. It is believed that the ring structures of PDADMAC and PVBTACl help to impart thermal stability.

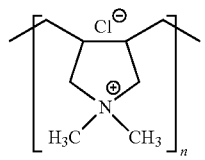
(VIII)

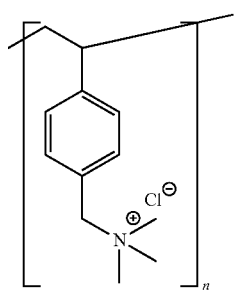
(IX)

In another example, bonding layer 205 can be formed by the deposition of a polymer comprising a pyridinium cation. The aromatic ring of the pyridine or pyrrole can further include any suitable number of substituents covalently bonded to one or more of the ring carbons and/or the nitrogen, and can be independently selected from H, alkyl, vinyl, allyl, amino, glycidyl, and thiol. Each substituent can be further substituted, unsubstituted, protected, or unprotected. Where an alkyl substituent is selected, the substituent may be branched or unbranched, saturated or unsaturated. Examples of alkyl groups include methyl, ethyl, n-propyl, iso-propyl, n-butyl, iso-butyl, tert-butyl, n-hexyl, n-decyl, tetradecyl, and the like. Preferred examples of polymers containing pyridinium cations include poly(4-vinyl-1-methylpyridinium bromide) (PVMPyBr) (X) and poly(4-vinylpyridine hydrochloride) (PVPyCl) (XI). Both of these polymers were selected due to the presence of a quaternary nitrogen in an aromatic ring, which is believed to increase thermal stability.

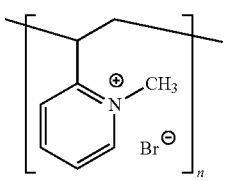
(X)

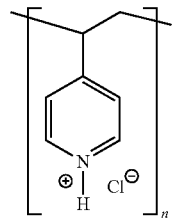
(XI)

In yet another example, bonding layer 205 can be formed by the deposition of a polymer comprising an imidazolium cation. As described above, an imidazole can be substituted or unsubstituted with a wide variety of suitable substituents covalently bonded to the ring structure. A preferred example of a polymer comprising an imidazolium cation is LUVIQUAT FC 550 (BASF) (XII), a quaternary copolymer of 1-vinylpyrrolidone and 3-methyl-1-vinylimidazolium chloride. LUVIQUAT was selected for the present application due to the combination of the imidazolium ring and the vinylpyrrolidone.

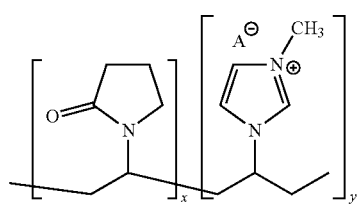
(XII)

In one example of anionic polymer deposition, bonding layer 205 can be formed by the deposition of a polymer comprising a negatively charged oxygen. In some embodiments, bonding layer 205 can be formed by the deposition of a polymer comprising a polysulfate anion. In another example, bonding layer 205 can be formed by the deposition of a polymer comprising a polyacrylate anion. In some embodiments, bonding layer 205 can be formed by the deposition of a polymer comprising a polysulfonate anion. A preferred example of an anionic polymer comprising a polysulfonate anion is poly(sodium-4-styrene sulfonate) ("PSS") (XIII).

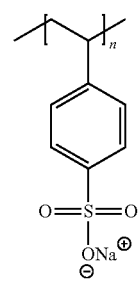
(XIII)

In yet other embodiments, the surfactant of bonding layer 205 can be selected from diethanolamide and derivatives thereof (e.g., coconut diethanolamide), polyethylene glycols, 4-nonylphenyl-polyethylene glycol, bisphenol A ethoxylate, octoxynol-9, octylphenol ethoxylate and combinations thereof. The surfactant solution can include one or more surfactants in a concentrated or diluted weight percentage, e.g., one or more surfactants can be in the range of about 0.1 or 0.5 to about 99 weight percent, or in a range from about 1 to 75 weight percent, in a range from about 2 to about 50 weight percent, in a range from about 5 to about 30 weight percent, for example 8, 10, 15, 20 or 25 weight percent. The surfactant solution can further include conventional components as known in the art, such as a liquid carrier.

Figure 9:
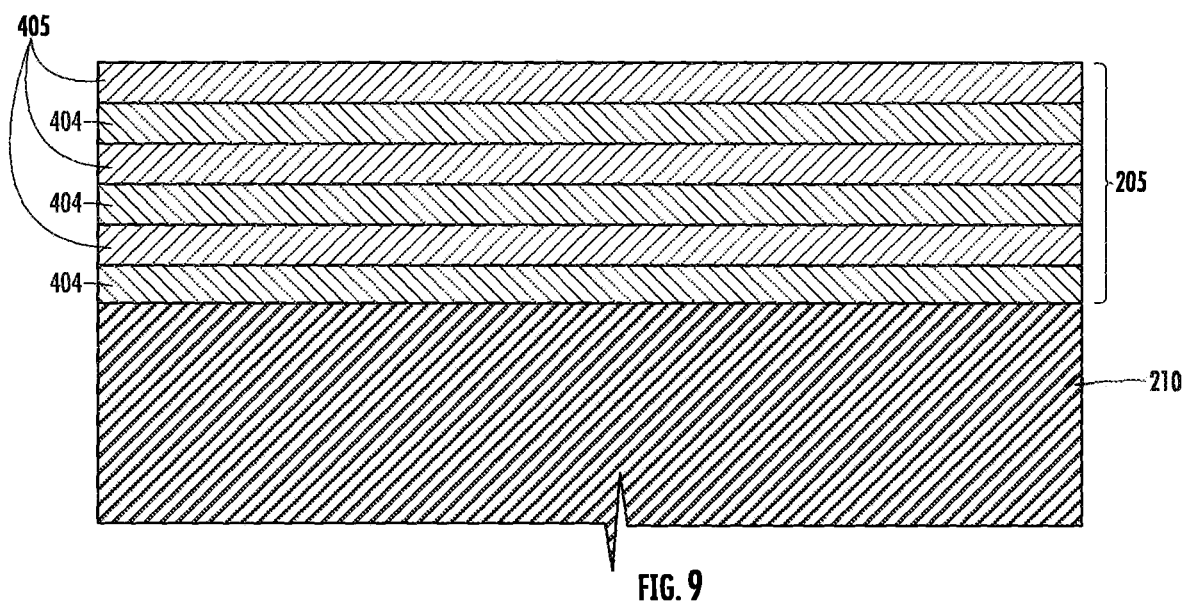
FIG. 9 is a cross-sectional view of a portion of the article according to embodiments of the present disclosure.

In some embodiments, bonding layer 205 comprises layers of one or more of the aforementioned organic and/or inorganic materials. For example, bonding layer 205 may comprise alternating layers of first and second materials. In one exemplary embodiment, as shown in FIG. 9, bonding layer 205 comprises alternating layers of a first cationic polymer layer 404 and a second anionic polymer layer 405. First cationic polymer layer 404 may first be deposited directly onto support substrate 210, followed by deposition of second anionic polymer layer 405. The deposition process may then be repeated, with the first and second layers being deposited in an alternating fashion, until a desired number of layers is achieved.

In yet further embodiments, first layers 404 are each monolayers of the cationic polymer and second layers 405 are each monolayers of the anionic polymers. Without wishing to be bound by theory, it is believed that because identically charged polymers repel each other, application of a thicker layer of a single charged polymer (i.e. a thicker layer of an anionic polymer alone or a thicker layer of a cationic polymer alone) would not function as desired. That is, the polymeric layer may not adequately adhere to the glass surface (of, for example support substrate 210) or to itself when present in a single thicker layer. By alternating thinner layers (e.g., monolayers) of oppositely charged polymers, a more suitable bonding layer 205 can be obtained having sufficient thickness to even out any surface roughness and provide a planar, or substantially planar, surface to which substrates 210, 220 can bond.

In some embodiments, the bonding layer 205 may have an even number of total cationic and anionic polymer layers 404, 405. In some embodiments, bonding layer 205 may have an odd number of total cationic and anionic polymer layers 404, 405. For example, bonding layer 205 may contain from two to twenty five total cationic and anionic layers. In certain aspects, bonding layer 205 comprises 2 or more, 3 or more, 4 or more, 5 or more, 6 or more, 7 or more, 8 or more, 9 or more or 10 or more polymeric layers.

One of the advantages of the cationic and anionic polymers disclosed in the present disclosure is that the polymer layers can be applied through a simple, one-step processing to enable spontaneous bonding between first substrate 220 and support substrate 210 at room temperature. The ionic polymers described herein are highly hydrophilic due to the strong interactions between the charges along the polymer chains and the dipoles of the water molecules. Therefore, the glass surfaces coated with these polymers will remain highly hydrophilic and have a high surface energy. This may obviate the need for pressure lamination techniques to bond the surfaces or for energy-enhancing plasma treatment to increase the surface energy of bonding layer 205, as is often the case with organic polymers.

To apply the organic material of bonding layer 205 to the bonding surfaces 212, 222, support substrate 210 and first substrate 220 can be brought into contact with the organic material (e.g., rinsing, immersing or dip coating, spraying, spin coating, etc.). In some embodiments, support substrate 210 and first substrate 220 can be submerged or immersed in a solution of the organic material. The organic material solution can be agitated or mixed to generate movement of the solution against the bonding surfaces 212, 222. To generate fluid flow in the organic material solution, conventional mixing methods can be used. Pumps, impellers, vibration sources (e.g. ultrasonic) can be used to generate such fluid flow. Support substrate 210 and/or first substrate 220 can be in contact with the organic material solution for a pre-determined period of time, for example, for about 1 minute to about 60 minutes, or at least 1, 2, 3, 5, 10, 15 or 20 minutes. It is believed that contact with the organic material solution leads to the bonding surfaces (e.g., bonding surfaces 212, 222) becoming partially passivated with, for example, surfactant residuals and thus the formation of permanent covalent bonds (e.g., Si—O—Si) from hydroxyl groups can be minimized during bonding of support substrate 210 and first substrate 220. However, as discussed above, other methods than the submerging/immerging process can be used to apply bonding layer 205 to support substrate 210 and first substrate 220 such as, for example, dip coating, spray coating, or spin coating. If desired, bonding layer 205 can be subjected to additional steps, for example surface activation and annealing steps, in order increase the surface energy, decrease outgassing during processing and/or improve the bonding capabilities of bonding layer 205.

In one example, for applying the bonding layer 205 to one or both of the substrates 210, 220 such that the substrates have one or more roughened bonding surfaces, a typical wash procedure was first used. In this example, support substrate 210 was washed with the typical wash procedure and then treated with a cationic polymer, which can be done by spin coating, spray coating, or dip coating. The treated surface of support substrate 210 was then dried. A typical wash procedure was then used on the polycationic coated and dried surface of support substrate 210.

In this example, support substrate 210 was then treated with an anionic polymer, which can also be done by spin coating, spray coating, or dip coating. The anionic polymer treated surface of support substrate 210 was then dried. A typical wash procedure was then used on the polyanionic coated and dried surface of support substrate 210.

This layering process of the cationic polymer layer and the anionic polymer layer can be repeated until the polymeric layers provide the desired planarization to support substrate 210. After drying, the coated support substrate 210 was bonded to a thin sheet of substrate (for example, first substrate 220). In this example, the bonded substrates were then thermally annealed to achieve the desired bond energy between the bonded substrates.

Figure 10:
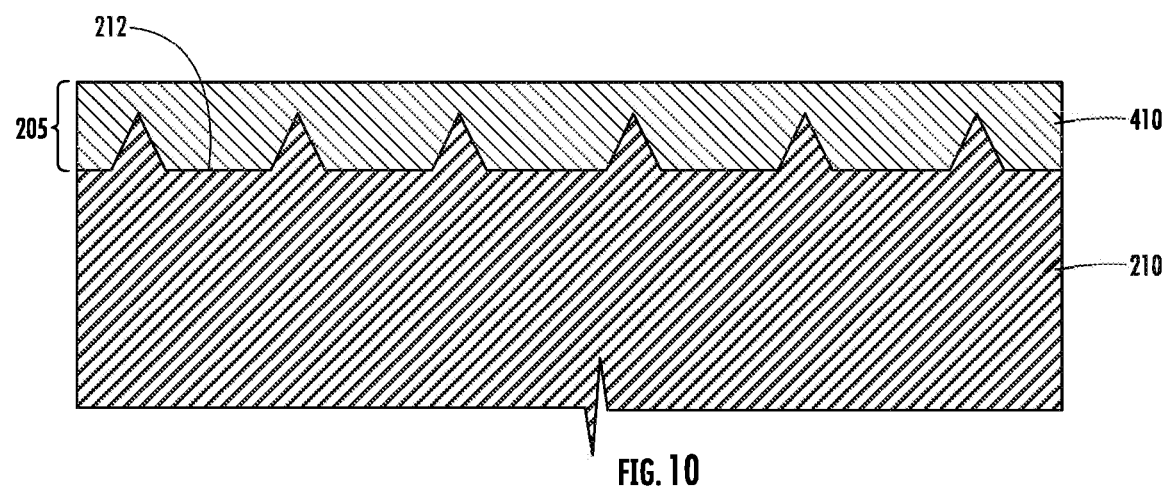
FIG. 10 is another cross-sectional view of a portion of the article according to embodiments of the present disclosure.

In a second example, as shown in FIG. 10, bonding layer 205 comprises an organic material layer 410, which was applied to a support substrate 210 with a roughened bonding surface 212. In this example, layer 410 is an organometallic layer. A thickness of organometallic layer 410 is sufficient to cover the roughened surface of support substrate 210, such that organometallic layer 410 provides planarization to surface 212 of support substrate 210. In some embodiments, the thickness of organometallic layer 410 is in a range from about 1 nm to about 30 nm, or about 2 nm to about 20 nm, or about 4 nm to about 10 nm.

Figure 11:
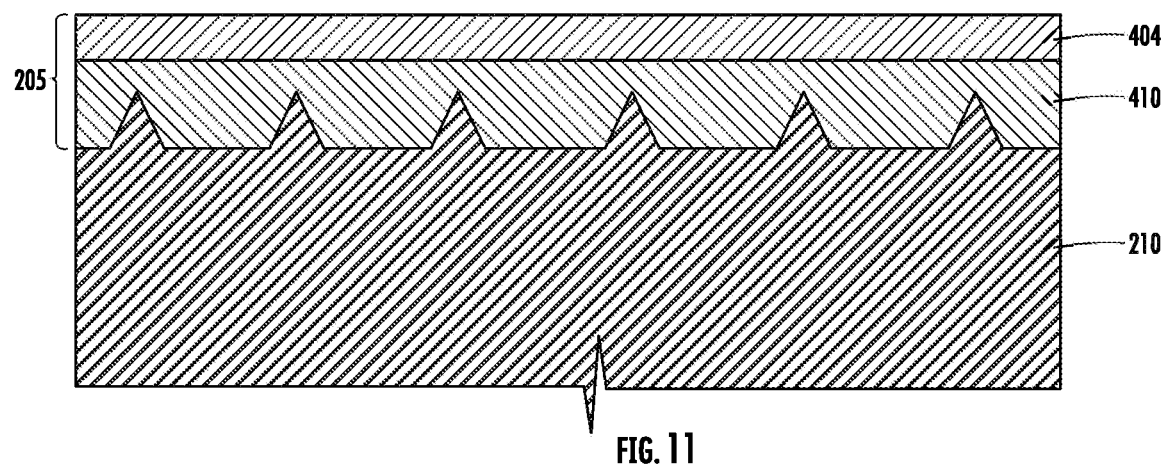
FIG. 11 is another cross-sectional view of a portion of the article according to embodiments of the present disclosure.

In yet a further example, as shown in FIG. 11, bonding layer 205 comprises organometallic layer 410 along with one or more layers of other organic materials. For example, bonding layer 205 comprises one or more layers of a cationic polymer, anionic polymer, organic salt, and/or surfactant disposed on organometallic layer 410. As shown in FIG. 11, in this embodiment, bonding layer 205 comprises a single cationic polymer layer 404 disposed on organometallic layer 410. However, as discussed above, it is also contemplated that bonding layer may comprise, for example a single anionic polymer layer 405 or multiple, alternating layers of cationic polymer layer 404 and anionic polymer layer 405. The layers 404, 405 may be applied to organometallic layer 410 using the processes disclosed above. The coated support substrate 210 may then be bonded to a substrate (for example, first substrate 220). In other embodiments, bonding layer 205 comprises one or more surfactants, such as a cationic surfactant layer, disposed on organometallic layer 410.

In yet another example, layer 410 of FIG. 11 comprises an inorganic material, such as, for example, silicate and/or titanate, and layer 404 comprises one or more cationic polymer layers and/or anionic polymer layers, as discussed above. In yet other embodiments, layer 410 comprises an inorganic material and layer 404 comprises one or more surfactants, such as a cationic surfactant layer.

In embodiments disclosed herein, support substrate 210 may be prepped prior to bonding with bonding layer 205 in order to enhance and increase the bond energy between these components. More specifically, support substrate 210 is cleaned with a cleaning solution and then subjected to an activation process prior to bonding with bonding layer 205. In some additional embodiments, support substrate 210 is also dried with, for example, a spin-drying process after the activation process and before the bonding step. The cleaning solution may include an ammonium hydroxide ($NH_4OH$) solution followed by a rinse. The activation process may include an ammonium hydroxide solution.

In one example, 150 mm×150 mm EXG glasses, each with a thickness of 0.5 mm, were used as the support substrate 210. The glasses each had a surface roughness of 0.5 nm (as measured by AFM) and a TTV value of 0.2 microns. Before bonding the glasses with a bonding layer 205, the glasses were first cleaned with an ammonium hydroxide solution (with a ratio of $NH_4OH:H_2O_2:H_2O$ being equal to 1:4:20) at 70° C. for 485 seconds. Next, the glasses were rinsed with water. Following the rinse, the glasses were activated with an ammonium hydroxide solution (with a ratio of $NH_4OH:H_2O_2:H_2O$ being equal to 6:1:3) at 65° C. for between 10-30 minutes. The glasses were then each bonded to the bonding layer 205 while the surfaces of the glasses were still wet with the activation solution. Furthermore, the glasses were then bonded to a fusion-drawn glass (the first substrate 220) with a surface roughness of 0.2 nm. As discussed above, the bonded glasses and bonding layer 205 were then thermally annealed to increase their bond strength.

In this example of prepping the support substrate 210, a first glass was exposed to the activation solution for 10 minutes and then, after bonding with the bonding layer 205, was annealed at 150° C. for 2 hours. The bond energy of the first glass increased from 111 mJ/m² to 369 mJ/m² after the annealing process. A second glass was exposed to the activation solution for 30 minutes and then, after bonding with the bonding layer 205, was annealed at 150° C. for 2 hours. The bond energy of the second glass increased from 210 mJ/m² to 544 mJ/m² after the annealing process. It was also found that the bond energy between the glass and the bonding layer 205 could be further increased to 602 mJ/m² by annealing for longer times, such as 48 hours, at the same temperature of 150° C.

In a second example of prepping the support substrate 210 prior to bonding with the bonding layer 205, the same EXG glass was used as described above with reference to the prior example. Similar to the prior example, the glasses were exposed to the same cleaning and activation processes. However, in this example, the glasses were spun-dry prior to bonding with the bonding layer 205 and the fusion-drawn glass (the first substrate 220). More specifically, the EXG glasses were exposed to the activation solution for 30 minutes and then spun-dry using either one of the three following drying processes: (i) low level of spin-drying using 800 rpm for 1 minute; (ii) medium level of spin-drying using 1600 rpm for 1 minute; (iii) high level of spin-drying using 1600 rpm for 2 minutes.

Next the EXG glasses were each bonded to the bonding layer 205 and the fusion-drawn glass and then annealed at 120° C. for 2 hours. The bond energy was measured to be about 200 mJ/m² to about 290 mJ/m². The bond energy significantly increased, though, to about 875 mJ/m² to about 1116 mJ/m² when the annealing time increased to about 48 hours.

These examples regarding the prepping of the support substrate 210 prior to bonding with bonding layer 205 and the first substrate 220 show that such prepping steps can significantly increase the bond energy between these components. More specifically, the cleaning and activation processes significantly increase the bond energy between these components. Additionally, adding a drying step after the activation step can further increase the bond energy between these components.

It will be apparent to those skilled in the art that various modifications and variations can be made to the disclosed embodiments without departing from the spirit and scope of the disclosure. Thus, it is intended that the present disclosure cover any and all such modifications and variations as come within the scope of the appended claims and their equivalents.

What is claimed is:

1. An article comprising:
a support unit comprising:
a support substrate comprised of glass, glass ceramic, ceramic, or silicon and having a surface; and
a bonding layer directly bonded to the surface of the support substrate,
wherein a total thickness variation TTV across an entire width of the bonding layer is about 3.0 microns or less and a total thickness variation TTV across an entire width of the support unit is about 2.0 microns or less.

2. The article of claim 1, wherein the total thickness variation TTV across the width of the support unit is about 1.0 microns or less.

3. The article of claim 2, wherein the total thickness variation TTV across the width of the support unit is about 0.2 microns or less.

4. The article of claim 1, wherein:
a total thickness variation TTV across a width of the support substrate is about 1.0 micron or less, and
a total thickness variation TTV across a width of the bonding layer is about 1.0 micron or less.

5. The article of claim 1, wherein the support substrate has a surface roughness of about 1.0 nm or less.

6. The article of claim 1, further comprising a first substrate, the bonding layer coupling the support substrate with the first substrate.

7. The article of claim 6, wherein the first substrate comprises lithium tantalate ($LiTaO_3$), lithium niobate ($LiNbO_3$), aluminum nitride (AlN), lead zirconate titanate (PZT) ($Pb[Zr_xTi_{1-x}]O_3$ ($0 \leq x \leq 1$)), or a combination thereof.

8. The article of claim 6, wherein the first substrate has a thickness of about 2.0 microns or less.

9. The article of claim 1, wherein the bonding layer has a thickness of about 100 nm or less.

10. The article of claim 9, wherein the thickness of the bonding layer is about 20 nm or less.

11. The article of claim 1, wherein the bonding layer comprises one or more surfactants, one or more polymers, one or more organic salts, one or more inorganic materials, or combinations thereof.

12. The article of claim 11, wherein the bonding layer consists of alternating layers of first and second layers, the first layer being a monolayer of a cationic polymer and the second layer being a monolayer of an anionic polymer.

13. The article of claim 12, wherein one of the first layers is directly attached to the support substrate.

14. The article of claim 13, wherein the bonding layer comprises a cationic surfactant with a head group comprising a charged nitrogen selected from a group consisting of primary, secondary, tertiary, or quaternary ammonium, pyridinium, and combinations thereof.

15. The article of claim 1, wherein a thickness of the support substrate is in a range from about 0.3 mm to about 1.0 mm.

16. An article comprising:
a support unit comprising:
a support substrate comprised of glass, glass ceramic, ceramic, or silicon and having a surface; and
a bonding layer directly bonded to the surface of the support substrate,
wherein a total thickness variation TTV across an entire width of the bonding layer is about 3.0 microns or less and a total thickness variation TTV across a width of the support unit is about 2.0 microns or less;
a first substrate, the bonding layer coupling the support substrate with the first substrate; and
a device support wafer removably coupled with the support substrate.

* * * * *